(12) United States Patent
Davison et al.

(10) Patent No.: US 9,542,051 B2
(45) Date of Patent: Jan. 10, 2017

(54) ANALOG ELIMINATION OF UNGROUNDED CONDUCTIVE OBJECTS IN CAPACITIVE SENSING

(71) Applicant: Microchip Technology Incorporated, Chandler, AZ (US)

(72) Inventors: Burke Davison, Chandler, AZ (US); Xiang Gao, Chandler, AZ (US); Yann LeFaou, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/566,183

(22) Filed: Dec. 10, 2014

(65) Prior Publication Data

US 2016/0117014 A1    Apr. 28, 2016

Related U.S. Application Data

(60) Provisional application No. 62/068,450, filed on Oct. 24, 2014.

(51) Int. Cl.
*G06F 3/044* (2006.01)
*H03K 17/96* (2006.01)

(52) U.S. Cl.
CPC ............ *G06F 3/044* (2013.01); *H03K 17/962* (2013.01); *H03K 2017/9606* (2013.01); *H03K 2017/9613* (2013.01); *H03K 2217/960705* (2013.01); *H03K 2217/960725* (2013.01); *H03K 2217/960765* (2013.01); *H03K 2217/960775* (2013.01)

(58) Field of Classification Search
CPC .... G06F 3/044; G06F 3/0412; G06F 3/03547; G06F 2203/041
See application file for complete search history.

(56) References Cited

U.S. PATENT DOCUMENTS

2013/0090873 A1* 4/2013 Lundstrum .......... H03K 17/962
702/64
2015/0331535 A1* 11/2015 Li ......................... G06F 3/0416
348/174

OTHER PUBLICATIONS

Davison, Burke, "AN1478: mTouch™ Sensing Solution Acquisition Methods Capacitive Voltage Divider," Microchip Technology Incorporated, 28 pages, Oct. 26, 2012.
Partial International Search Report and Invitation to Pay Additional Fees, PCT/US2015/013057, 6 pages, Jul. 3, 2015.
International Search Report and Written Opinion, Application No. PCT/US2015/013057, 18 pages, Oct. 2, 2015.

* cited by examiner

*Primary Examiner* — Premal Patel
(74) *Attorney, Agent, or Firm* — Slayden Grubert Beard PLLC

(57) ABSTRACT

In a method for performing a touch determination with a capacitive sensor, a self capacitance measurement of a capacitive sensor is initiated, wherein at the same time a mutual capacitance measurement including the capacitive sensor is performed. Such a method can be performed such that the self capacitance measurement and the mutual capacitance measurement differentially cancel with ungrounded conductive objects approaching or touching the capacitive sensor and additively combine for grounded objects approaching or touching the capacitive sensor.

11 Claims, 13 Drawing Sheets

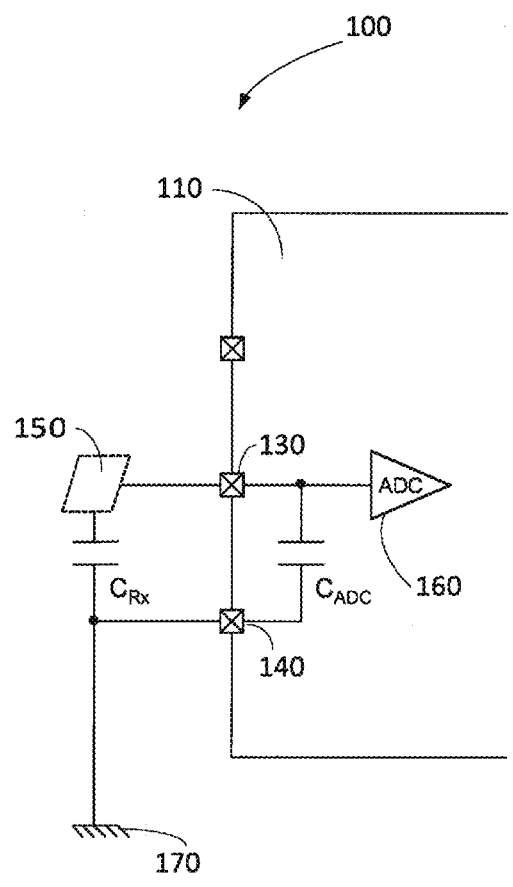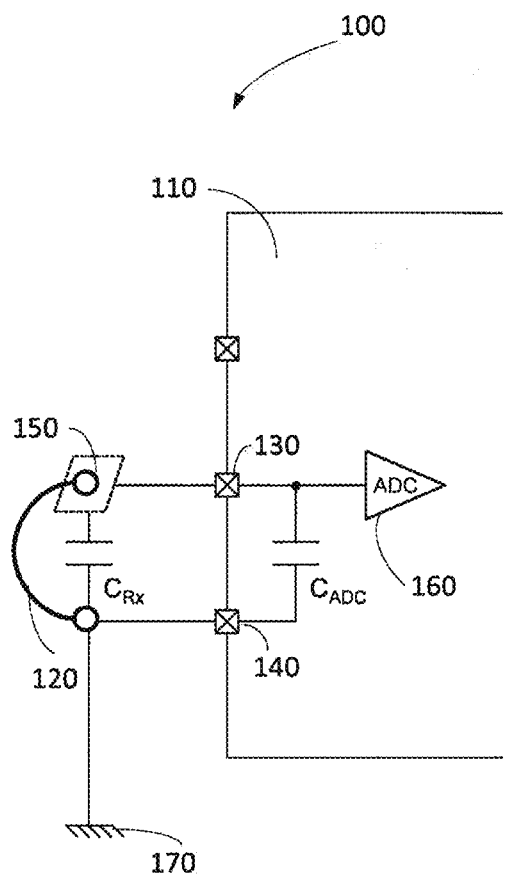
*Figure 1 (Prior Art)*
*Figure 2 (Prior Art)*

ANALOG ELIMINATION OF UNGROUNDED CONDUCTIVE OBJECTS IN CAPACITIVE SENSING

CROSS-REFERENCE TO RELATED APPLICATIONS

This application claims the benefit of U.S. Provisional Application No. 62/068,450 filed on Oct. 24, 2014, which is incorporated herein in its entirety.

TECHNICAL FIELD

The present disclosure relates to a capacitive sensing, in particular analog elimination of ungrounded conductive objects, such as high permittivity objects, in capacitive sensing.

BACKGROUND

Capacitive touch surface need to be free from contamination to work properly. Capacitive touch sensing in certain environments, however, exposes the touch surface to liquids or other materials that contaminate the surface and have a negative effect on the sensing characteristics. Hence, there is a need for capacitive touch sensing that is not influenced by contamination of the touch surface, in particular water on the touch surface.

Existing solutions for water resistance in capacitive sensing use mutual capacitance only and cause a negative shift on the signal when water is introduced to the system, and a positive shift when a finger is introduced. When water is removed from the system, a false trigger can occur if removing the negative shift causes too large of a positive shift.

Other solutions to this problem use a software pattern-matching algorithm to detect the difference in behavior between water and a finger. This leads to large overhead and the possibility that not all patterns of behavior have been considered.

SUMMARY

According to an embodiment, in a method for performing a touch determination with a capacitive sensor, a self capacitance measurement of a capacitive sensor is initiated, wherein at the same time a mutual capacitance measurement including the capacitive sensor is performed.

According to a further embodiment, after the sensor has been set to a high impedance state during the self capacitance measurement, a pulse can be capacitively coupled into the capacitive sensor for performing the mutual capacitance measurement. According to a further embodiment, a shield or guard electrode can be arranged in proximity to the capacitive sensor to provide a capacitive coupling. According to a further embodiment, the self capacitance measurement can be a capacitive voltage divider measurement. According to a further embodiment, the self capacitance measurement is a charge time measurement. According to a further embodiment, the method may further comprise a calibration method, wherein the calibration method is performed before performing a touch determination. The calibration method may comprise the steps of: performing an individual self capacitance measurement and storing a first measurement value; performing an individual mutual capacitance measurement and storing a second measurement value; and calculating a scale factor from said first and second measurement values; wherein the method for performing a touch determination includes applying said scale factor to said self capacitance or said mutual capacitance measurement.

According to another embodiment, a method for performing a touch determination with a capacitive sensor may comprise the steps of: charging an first capacitor to a first level and an second capacitor of a sensor to a second level; coupling first and second capacitor in parallel while the sensor is set to high impedance and feeding a pulse to a guard sensor being capacitively coupled with the sensor; after a settling phase determining a first settled voltage level of the parallel coupled capacitances; thereafter charging the first capacitor to the second level and the second capacitor of the sensor to the first level; coupling first and second capacitor in parallel while the sensor is set to high impedance, wherein the pulse is terminated after coupling of the first and second capacitors; and after a settling phase determining a second settled voltage level of the parallel coupled capacitances.

According to a further embodiment, the first level can be a predetermined voltage $V_{DD}$ and the second voltage level is a ground level $V_{SS}$. According to a further embodiment, the second level can be a predetermined voltage $V_{DD}$ and the first voltage level is a ground level $V_{SS}$. According to a further embodiment, the pulse may have a voltage level of $V_{DD}$ and begins after expiration of a predetermined time period which starts when coupling the first and second capacitor in parallel.

According to yet another embodiment, a microcontroller for performing a touch determination with a capacitive sensor, may comprise: a capacitive measurement unit configurable to perform a self capacitance measurement and a mutual capacitance measurement and comprising a control unit operable to:—initiate a self capacitance measurement of a capacitive sensor coupled with the capacitive measurement unit, wherein at the same time a mutual capacitance measurement including the capacitive sensor is performed.

According to a further embodiment of the microcontroller, the capacitive measurement unit can be configured to switch to a high impedance state during the self capacitance measurement and to capacitively couple a pulse into the capacitive sensor for performing the mutual capacitance measurement. According to a further embodiment of the microcontroller, the capacitive measurement unit comprises a capacitive voltage divider measurement unit. According to a further embodiment of the microcontroller, the capacitive voltage divider measurement unit may comprise: a first switch unit coupled between an external pin and a sample and hold capacitor and operable to charge an externally connected capacitor to a first or second voltage level or to switch the externally connected capacitor in parallel with the sample and hold capacitor; a second switch unit coupled with the sample and hold capacitor and operable to charge the sample and hold capacitor to either said first or second voltage level; an analog to digital converter operable to be coupled with the parallel switched capacitors; and wherein the control unit is configured to control said first and second switch unit. According to a further embodiment of the microcontroller, the microcontroller may further comprise a second external pin coupled with an input/output port which is configurable to operate as an output port, wherein the control unit is configured to control the output port for performing a mutual capacitance measurement. According to a further embodiment of the microcontroller, the capacitive measurement unit may comprise a charge time measurement, wherein the control unit is configured to control a self capacitance measurement with said charge time measurement unit, wherein the charge time measurement unit is connected with a first external pin which can be connected with a capacitive sensor. According to a further embodiment of the microcontroller, the microcontroller may further comprise a second external pin coupled with an input/output port which is configurable to operate as an output port, wherein the control unit is configured to control the output port for performing a mutual capacitance measurement. According to a further embodiment of the microcontroller, the control unit can be configured to perform a calibration before performing a touch determination, the control unit controls: an individual self capacitance measurement and stores a first measurement value; an individual mutual capacitance measurement and stores a second measurement value; and wherein the control unit or a processor of the microcontroller is configured to calculate a scale factor from said first and second measurement values; wherein for performing a touch determination the control unit is configured to applying said scale factor to said self capacitance or said mutual capacitance measurement. According to a further embodiment of the microcontroller, the scale factor may change charging levels during said self capacitance measurement or a voltage level during said mutual capacitance measurement.

According to another embodiment, a system may comprise such a microcontroller, and further comprise said capacitive sensor connected with the microcontroller through said first external pin and a shield or guard electrode arranged in proximity to the capacitive sensor connected with said second external pin.

According to yet another embodiment, a method for performing a touch determination with a capacitive sensor may comprise the step of initiating a self capacitance measurement of a capacitive sensor, initiating a mutual capacitance measurement including the capacitive sensor; performing a scaling of either an output value of the self capacitance measurement or the mutual capacitance measurement; and combining the output values of the self capacitance measurement and the mutual capacitance measurement.

According to a further embodiment of the above method, the method may further comprise combining the output values comprises adding the output values. According to a further embodiment of the above method, a shield or guard electrode can be arranged in proximity to the capacitive sensor to provide a capacitive coupling. According to a further embodiment of the above method, the self capacitance measurement can be a capacitive voltage divider measurement. According to a further embodiment of the above method, the self capacitance measurement can be a charge time measurement. According to a further embodiment of the above method, the method may further comprise a calibration method to determine a scaling factor, wherein the calibration method is performed before performing a touch determination, the calibration method comprising: performing an individual self capacitance measurement and storing a first measurement value; performing an individual mutual capacitance measurement and storing a second measurement value; and calculating a scaling factor from said first and second measurement values.

According to yet another embodiment, a method for performing a touch determination with a capacitive sensor, may comprise the step of initiating a self capacitance measurement of a capacitive sensor, wherein at the same time a mutual capacitance measurement including the capacitive sensor is performed such that the self capacitance measurement and the mutual capacitance measurement differentially cancel with ungrounded conductive objects approaching or touching said capacitive sensor and additively combine for grounded objects approaching or touching said capacitive sensor.

BRIEF DESCRIPTION OF THE DRAWINGS

FIGS. 1 and 2 show a conventional arrangement with capacitive touch sensor for measuring self capacitance;

DETAILED DESCRIPTION

Figure 3:
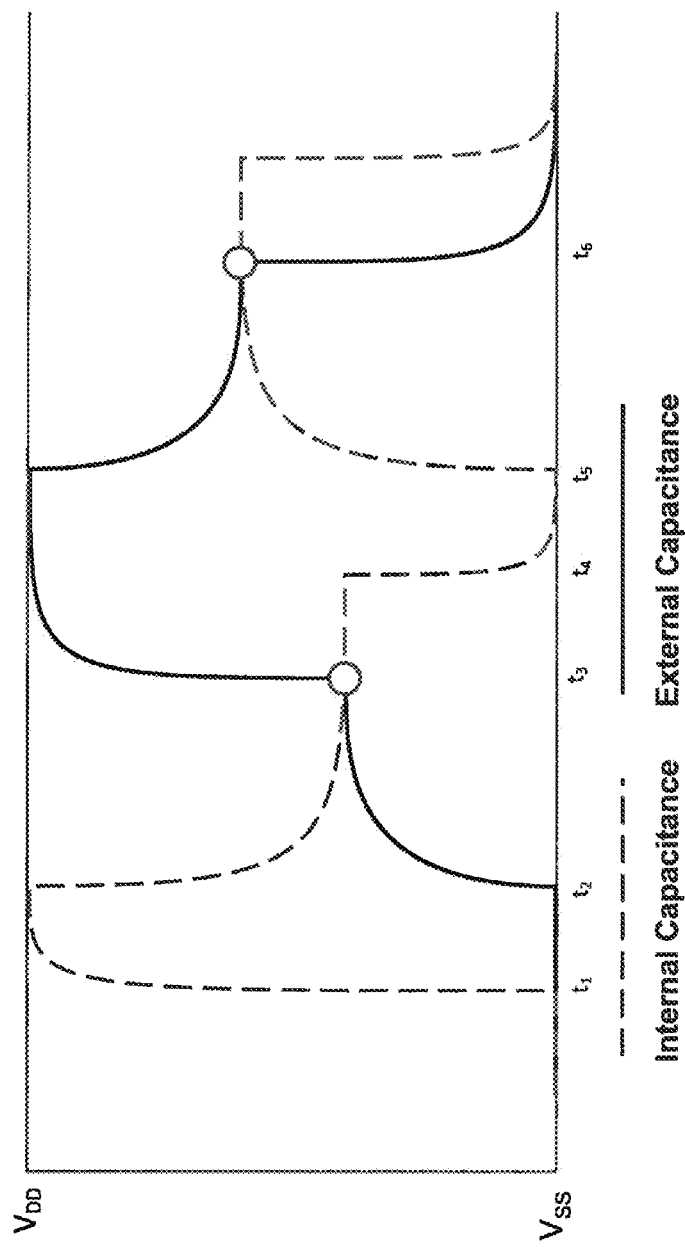
FIG. 3 shows an associated timing diagram of a self capacitance measurement.

According to various embodiments, self and mutual capacitances are combined to eliminate the analog signal shift for high permittivity objects, for example, ungrounded capacitive objects such as water, cleaners, and gasoline.

Self capacitance and mutual capacitance per se are known components of a capacitive touch system. FIG. 1 shows an arrangement 100 of a conventional capacitive touch sensor 150 coupled with a microcontroller 110 or front end device for evaluation of the touch status. The microcontroller 110 has an internal sample and hold capacitor CADC and an associated analog-to-digital converter (ADC) 160. The sample and hold capacitor CADC is coupled with external pins 130 and 140, wherein pin 140 can be a ground pin connected to ground 170. FIG. 1 does not show various internal switches that may be used to connect the sample and hold capacitor CADC with pin 130, the input of ADC 160, reference voltage, and ground as these may vary and depend on the implementation. The sensor pad 150 is connected externally to pin 130 and provides for a capacitive coupling with ground 170 as shown in FIG. 1 with reference symbol CRX. This represents the standard circuit model used in many applications to determine a touch in a user interface. The sensor couples into the board's ground 170. The microcontroller is connected to the board's ground 170 via pin 140.

This capacitive system consists of a known, fixed internal capacitance (CADC) and an unknown, varying external capacitance (CRX). The external sensor 150 is a conductive object connected to a microcontroller's analog input 130 and it couples into the board's ground 170. The sensor 150 may have any suitable shape depending on the application. For example, it may be formed within any layer of a printed circuit board or within any type of suitable substrate. In case it is formed on a top layer and therefore exposed, it may be sealed by a non-conductive layer if necessary.

FIG. 2 shows the definition of "self capacitance" which is the capacitance measured between the sensor and the microcontroller's ground reference. The amount of coupling indicated by line 120 between the sensor and the board's ground is the 'self capacitance' of the sensor 150. It depends on environmental parameters, such as objects in its proximity and therefore can be used to detect a touch by a user.

The waveform in FIG. 3 shows how a self-capacitance measurement is performed, for example using a capacitive voltage divider (CVD) scan available in many microcontrollers, for example microcontrollers manufactured by Applicant. A CVD peripheral and its application is known for example from Microchip's application note AN1478 which is hereby incorporated by reference. It is also possible to use many other techniques such as Microchip's Charge Time Measurement Unit (CTMU) as known for example from Microchip's application note AN1375 which is hereby incorporated by reference. The CVD acquisition method works by charging the internal capacitance to VDD, discharging the external capacitance to VSS, and then connecting the two capacitances to allow their voltages to settle to an intermediate point. This process is then repeated with the internal capacitance discharging to VSS, charging the external capacitance to VDD, and then connecting the two capacitances to allow their voltages to settle to an intermediate point.

FIG. 3 shows timing diagrams of the voltages across external capacitance CRX (solid line) and internal capacitance CADC (dotted line). The measurement can be accomplished by first charging the internal capacitance to VDD and discharging the external capacitance to VSS at time t1. As mentioned above, internal switches are provided within the microcontroller 110 to allow separate charges on external and internal capacitances CRX and CADC. At time t2 charging of the capacitances is stopped, and both capacitances CRX and CADC are connected together. They settle to a voltage based on the size of the internal capacitance CADC compared to the external capacitance CRX and a voltage measurement is performed by the ADC 160 at time t3. Then a reversed charging process starts at time t4. Now the external capacitance CTX is charged to VDD and the internal capacitance CADC is discharged to VSS. At time t5 both capacitances CRX and CADC are connected in parallel again and after voltage settling at time t6 a second voltage measurement is performed by the ADC 160.

The external capacitance CRX is the capacitance seen between the sensor pin 130 and the microcontroller's ground 170—or $C_{RX}$ in the circuit model. As the external capacitance $C_{RX}$ increases (ie: as the self capacitance increases), the first settling point at time $t_3$ will decrease and the second settling point at time $t_6$ will increase. Thus, the settling points will differentially shift. During the first part of the CVD waveform, the increase in the self-capacitance of the sensor will decrease the final settled voltage at time $t_3$. During the second part of the CVD waveform, the increase in the self-capacitance of the sensor will increase the final settled voltage at time $t_6$. A difference between the two measurements can be used for comparison with a threshold to determine whether a touch occurred or not.

Figures 4, 5:
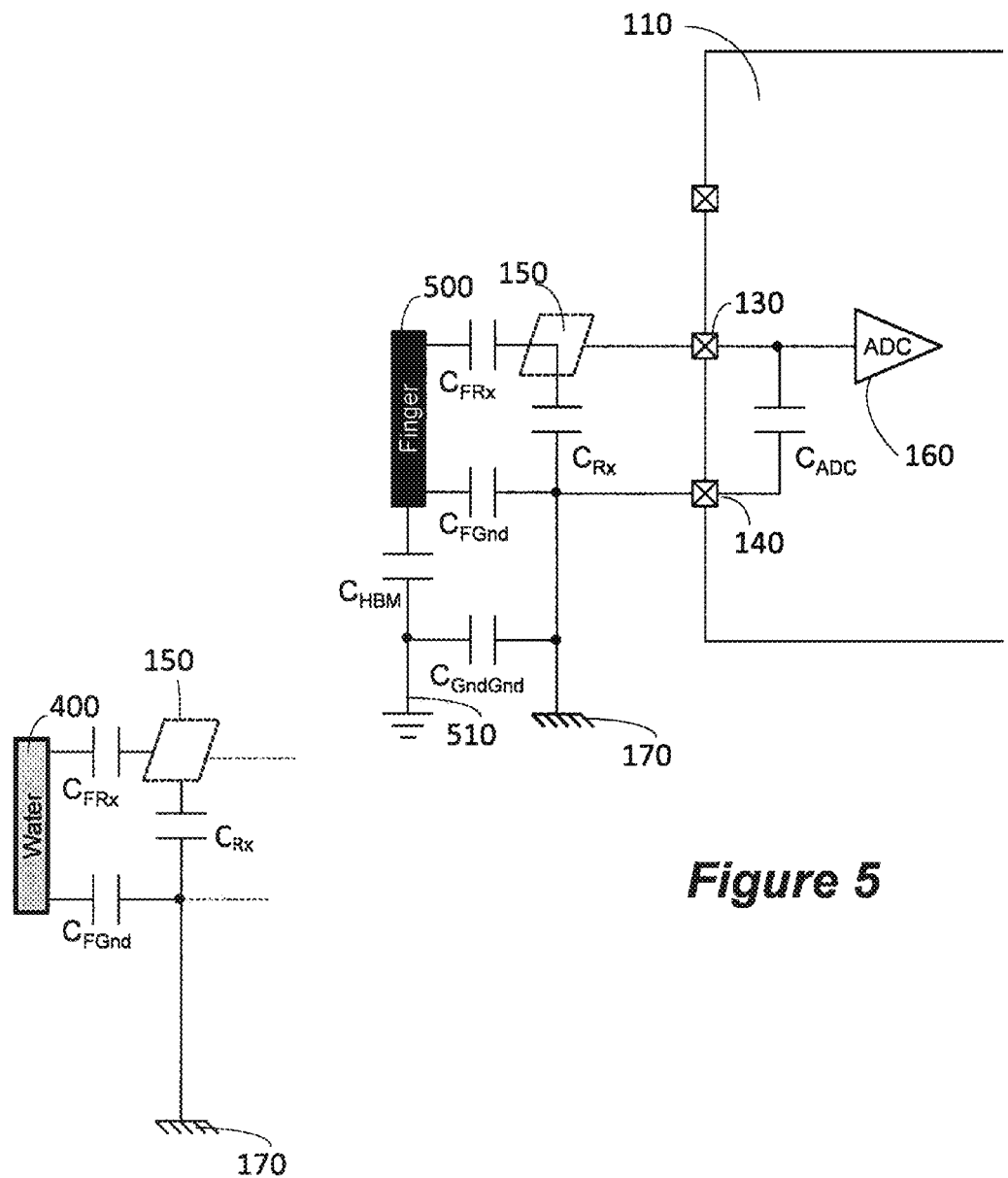
FIGS. 4 and 5 show the effect of a sensor contamination and a touch by a user, respectively.

FIG. 4 shows how a contaminant such as water 400 couples into the sensor via capacitive coupling CFRx and the board's ground via capacitive coupling CFGnd. This creates two capacitors in series which are both in parallel to CRX. CFRx is in series with CFGnd. CFRx and CFGnd are both in parallel with CRx. Adding parallel capacitance to CRx will increase the amount of capacitance seen between the sensor 150 and the microcontroller's ground 170. As a result, self-capacitance increases with water.

FIG. 5 shows self capacitance measurement with a finger 500 placed at the sensor 150. The finger has two coupling paths: A localized coupling path identical to the water behavior: CFRx and CFGnd are in series and create a parallel capacitance across CRx. A 'long distance' coupling path travels from CFRx to CHBM to CGndGnd. These three capacitances are in series and are also creating a parallel capacitance across CRx. CHBM ("Human Body Model") tends to be very large. CGndGnd, however, will vary based on the system.

Is the user completely isolated from the board's ground? $C_{GndGnd}$ is an open circuit and the effect of the $C_{FRx}$-$C_{HBM}$-$C_{GndGnd}$ path is removed.

Examples

A battery-powered cellphone sitting on a couch with the user touching the screen using only the tip of their finger.

An isolated power supply access panel with a non-conductive front panel.

Are the user the board sharing a ground? $C_{GndGnd}$ is a short circuit and the effect of $C_{FRx}$-$C_{HBM}$-$C_{GndGnd}$ is maximized.

Examples

A battery-powered cellphone that a user is holding. (The case is the phone's ground and is now shorted to the user's body.)

A non-isolated power supply access panel.

Is the system working in a 'grey-zone'? $C_{GndGnd}$ is some amount of capacitance that will cause the impact of the $C_{FRx}$-$C_{HBM}$-$C_{GndGnd}$ coupling path to vary.

Examples

Board connected to earth ground, but the user is wearing high heels.

Board is isolated, but a metal front panel couples to the user as they approach.

As a result, just like water, self-capacitance will increase when a finger 500 is added to the circuit. However, the new second coupling path can make the amount of added capacitance vary significantly. In practice, this effect can change the sensitivity of the system by a factor of 2.

When a human finger 500 is added to the circuit, it couples into the sensor 150 and the board's ground 170, but there is now also a coupling path through the user's human body model into earth ground 510 and then some amount of coupling between earth ground 510 and the board's ground 170 represented by $C_{GndGnd}$.

Figure 6:
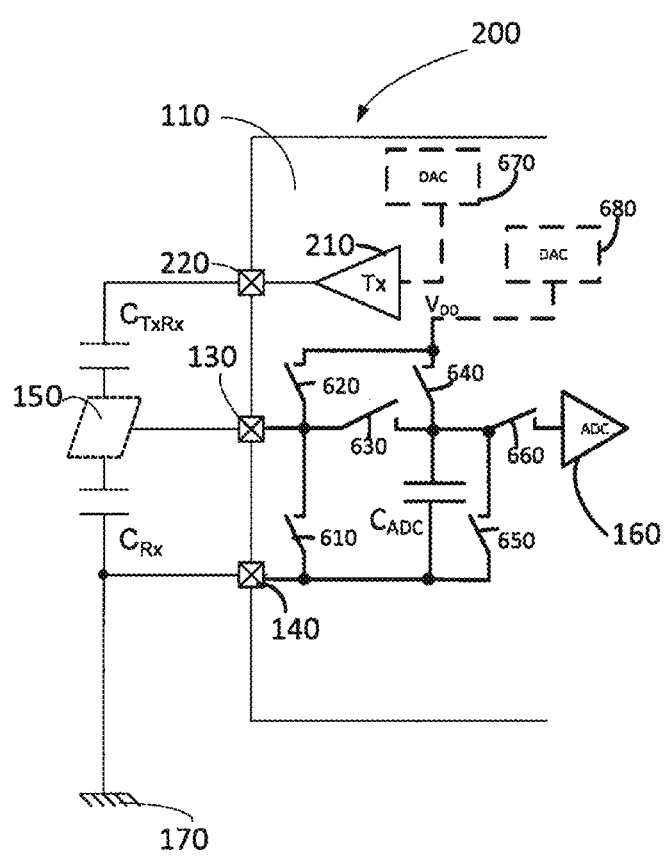
FIG. 6 shows an arrangement for a capacitive touch sensor according to various embodiments.
Figure 7A:
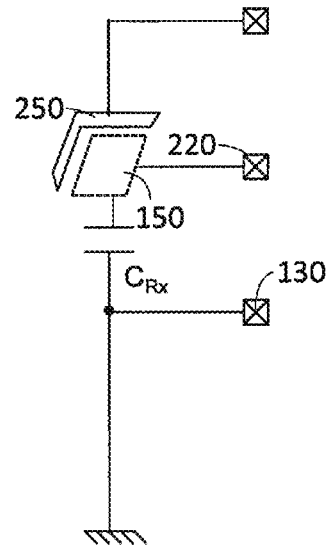
FIGS. 7a, b, c show embodiments of a guard or shield electrode.
Figure 7B:
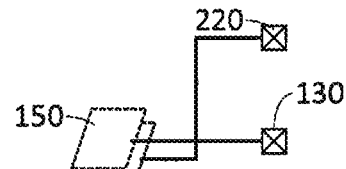
Figure 7C:
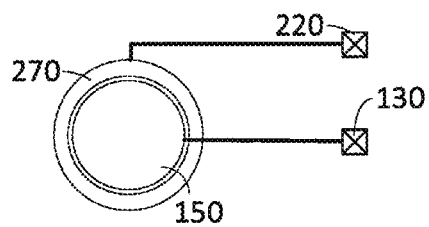

According to various embodiments, as for example shown in FIG. 6, a Tx drive signal, for example generated by an I/O port 210 of the microcontroller 110 is added to the circuit via external connection 220. To this end, a second electrode 250, 260, 270 may be provided as shown in FIGS. 7a-c. For example, a second electrode 270 may, for example, surround the sensor electrode 150 as a shield or guard as shown in FIG. 7c. However, the placement of the second electrode is not critical and it merely needs to be ensured that there is more capacitive coupling between the guard or shield electrode 250, 260, 270 and the sensor electrode 150 than between the guard or shield electrode 250, 260, 270 and the board's ground 170. Thus, according to one embodiment, the shield electrode 260 and sensor electrode 150 could be formed in different layers, for example, layers of a printed circuit board as shown in FIG. 7b. Any other arrangement of the electrodes is possible. For example, FIG. 7a shows an embodiment with a shield electrode 250 that only partially surrounds the sensor electrode 150. Many other ways for a capacitive coupling of the signal generated by port 210 are possible. FIG. 6 shows an output signal from the microcontroller called 'Tx' is now added to the circuit via such a capacitive coupling.

In addition, FIG. 6 shows also as an example, various switches 610-660 that allow for a separate charge of external and internal capacitor with either VDD or ground. Switch 660 may not be necessary if the ADC 160 has a high impedance input. Elements 670 and 680 and their function will be explained below with respect to FIG. 18. The switches may be controlled automatically by a state machine associated with the CVD unit. For a better overview, FIGS. 8 and 10-13 do not show the switches.

Figure 8:
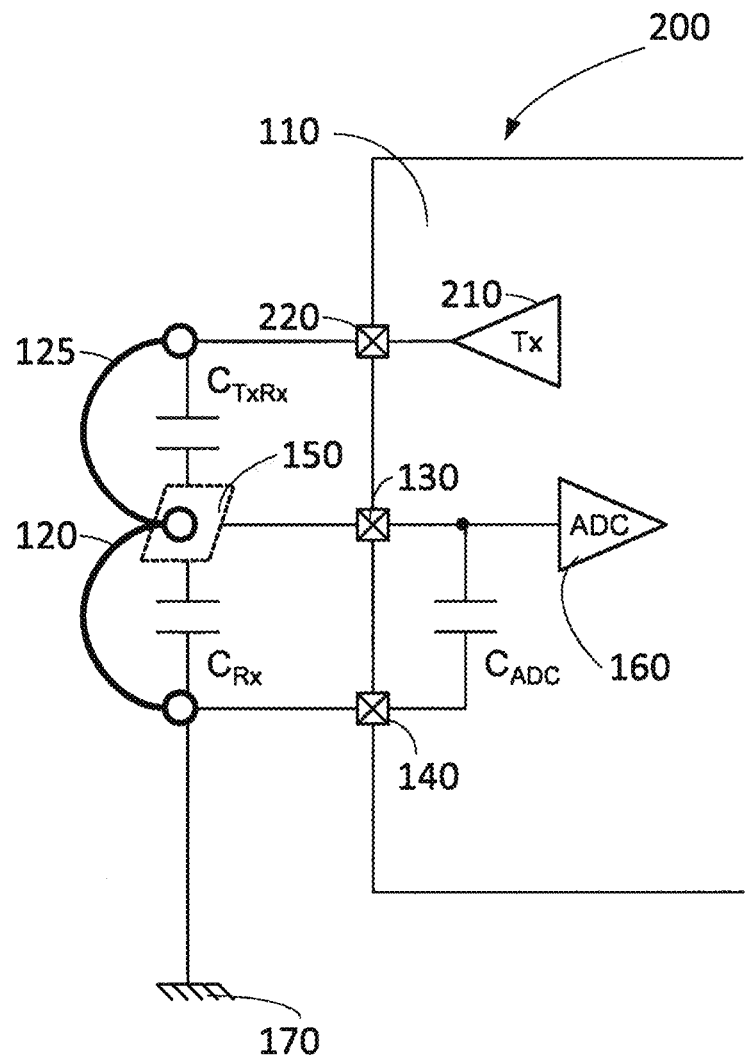
FIG. 8 explains the principle of measurement using an arrangement according to FIG. 6.

FIG. 8 shows the definition of "mutual capacitance" with reference symbol 125. FIG. 8 shows the AC coupling between the sensor 150 and a 'Tx' (aka 'Guard' or 'Shield') drive signal provided by port 210 via external connection 220. CTxRx represents the AC coupling between the low-impedance TX signal and the high-impedance sensor 150. In other words, pin 220 is an output pin and pin 130 an input pin. As the Tx signal moves, charge will bleed into the Rx sensor 150. The amount of AC coupling between the TX drive and the sensor 150 is called the mutual capacitance and is represented by CTxRx or reference symbol 125.

Figure 9:
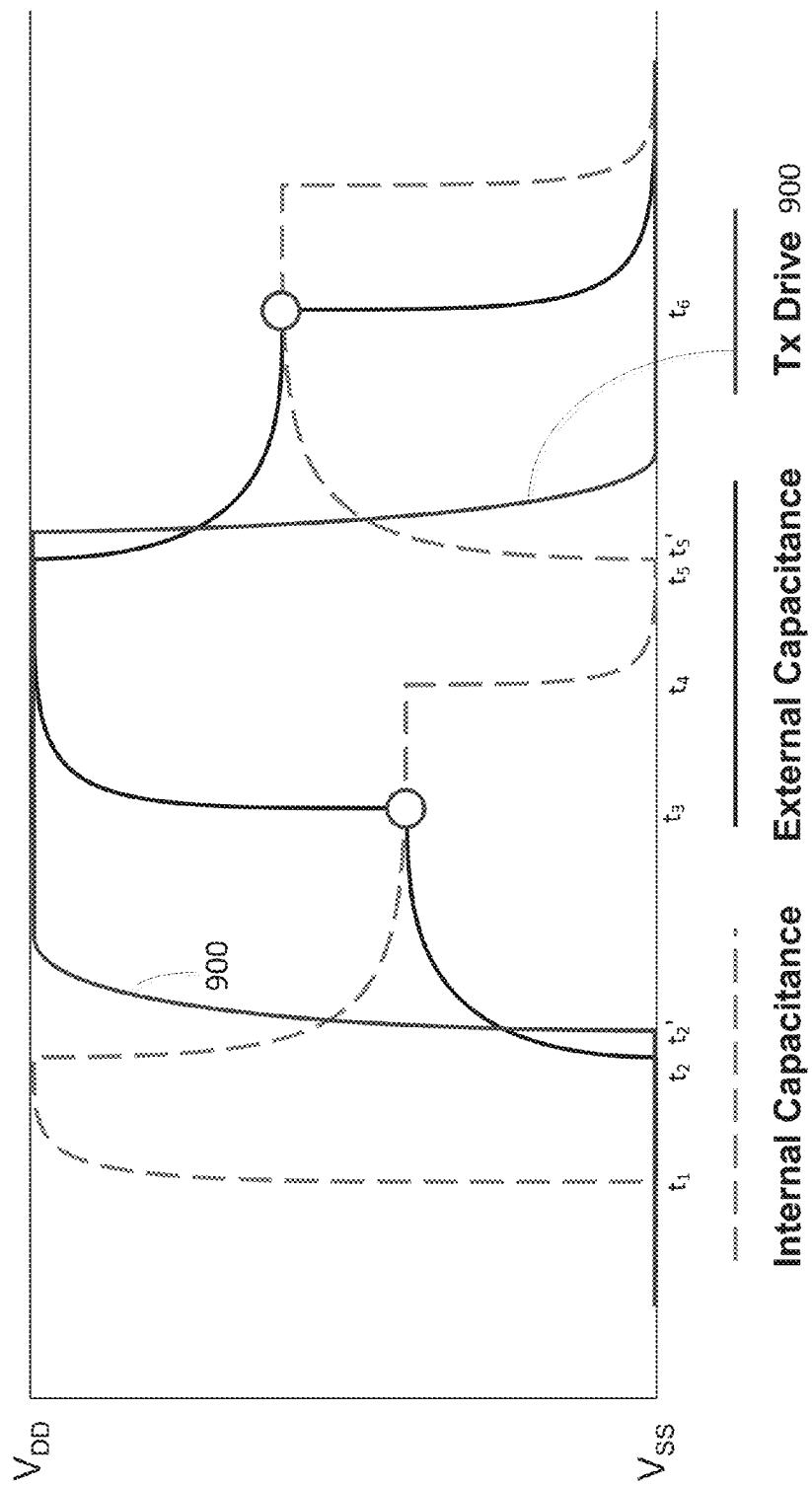
FIG. 9 shows associated timing diagrams.

FIG. 9 shows a timing diagram of the measurement and drive signals according to various embodiments in a similar way as FIG. 3. In particular, FIG. 9 shows how the TX signal 900 is driven with the CVD waveform. The measurement cycle starts in the same way as the one shown in FIG. 3 at time t1. After the first settling phase has begun at time t2, the TX signal is driven high at time t2'. The TX node 220 will couple charge into the RX sensor 150 causing the final settling point to be higher than it was before. Again, the second measurement starts at time t4 with reversed charging similar as in FIG. 3. After the second settling phase has begun at time t5, the TX signal 900 is driven low at time t5'. The TX node 220 will couple charge into the RX sensor 150 causing the final settling point to be lower than it was before. If mutual capacitance decreases, the offset caused by the TX signal 900 will be reduced. The effect will be a shift in the final settled voltage that is in the opposite direction as the TX drive. This will be in the same direction as when self capacitance increases. If mutual capacitance increases, the offset caused by the TX signal will be increased. This will be in the opposite direction as when self capacitance increases.

Drive signal 900 is driven in phase with the CVD waveform, but after the sensor has been set to a high-impedance input and is settling the voltages between the internal and external capacitances. The timing, for example the difference between t2 and t2' or between t5 and t5', is not critical and the rising edge of the pulse can start at any time after the high impedance setting is available. Thus, the pulse could come as early as the high impedance is available, for example, t2=t2' and t5=t5', or even after the settling time (t3 and t6) is reached which depending on the time difference of course would require additional settling time for the pulse charge. As shown in FIG. 9, a short time difference with t2'>t2 and t5'>t5 may be used according to various embodiments. As indicated, the same timing requirements may apply to the rising and the falling edge of the pulse 900. However, as timing is not critical, different time differences between t2 and t2' and between t5 and t5' may apply according to some embodiments.

During the first part of the CVD waveform t1 to t3, the TX drive 900 will couple into the sensor and cause the final settled voltage to be higher than it would have been without the TX coupling. During the second part of the CVD waveform t4 to t6, the TX drive 900 will couple into the sensor and cause the final settled voltage to be lower than it would have been without the TX coupling. Increases in the mutual coupling 125 between TX and the sensor 150 will cause this effect to increase.

The principle of adding a mutual capacitance charge according to various embodiments is not limited to the shown capacitive voltage divider measurement method. It can also be applied to other capacitive measurements as long as there it is a high impedance measurement that allows charging the sensor 150 via the capacitive coupling 125 between the shield/guard electrode 250, 260, 270 and the sensor electrode 150. As mentioned above, the principles according to the various embodiments can, for example, also be applied to a charge time measurement unit (CTMU) which is available in many microcontrollers manufactured by Applicant.

Figure 10:
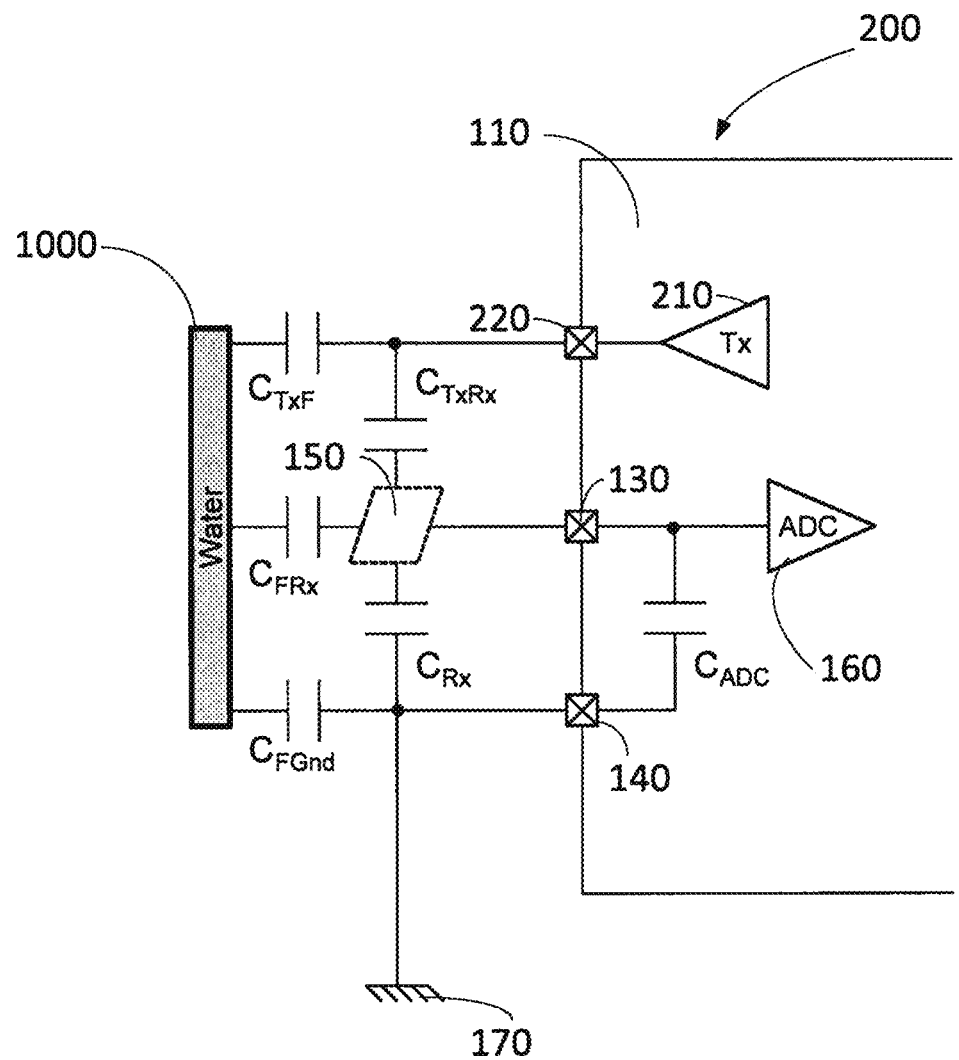
FIGS. 10-13 shows the effect of a sensor contamination and a touch by a user, respectively.

FIG. 10 shows how a contaminant such as water 1000 couples into the Tx drive (CTxF), the sensor (CFRx), and the board's ground (CFGnd) according to various embodiments. The existence of the water 1000 slightly decreases CTxRx because it redirects some of the charge away from the sensor 150 and into the water 1000. The board may be designed such that CFRx is much greater than CFGnd. This can be accomplished, for example, by simply keeping ground way from the sensors 150. When water 1000 is added to the circuit, it couples to the TX drive pin 220, the sensor 150, and the board's ground 170.

Figure 11:
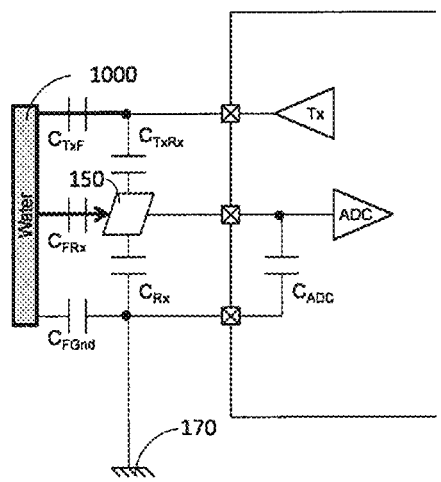
Figure 12:
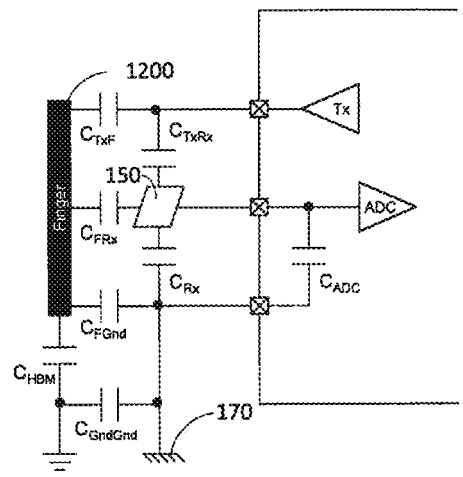

FIG. 11 shows that since CFRx>CFGnd, the charge that travels through CTxF is redirected through CFRx into the sensor 150. The water 1000 will decrease CTXRX and redirect the charge through CTXF. According to an embodiment, the board has been designed to make CFRX larger than CFGND. So the charge in the water 1000 is now redirected into CFRX. So, water 1000 decreases CTXRX but redirects the charge back into the sensor 150 through another path. The overall effect is an increase in the mutual capacitance between TX and the sensor 150.

Although CTxRx decreased due to the water 1000, the CTxF-CFRx path causes an overall increase in the coupling between Tx and Rx. As a result, the mutual capacitance between the shield/guard electrode 250, 260, 270 and the sensor 150 increases when water 1000 is added to the circuit.

If CFRx<CFGnd, the charge that travels through CTxF would be redirected through CFGnd into the board's ground 170. This would result in a decrease in the coupling between Tx and Rx. As a result, the mutual capacitance would decrease. This is the opposite behavior as previously described, and will be catastrophic to the ability of this method to differentiate an ungrounded capacitive object and a grounded capacitive object. A difference in the shift direction of the mutual coupling signal is essential to the proper application of this method.

Also, it has to be remembered that self capacitance is increased because of the parallel CFRx-CFGnd coupling path. As a result, water 1000 causes self capacitance to increase and mutual capacitance to increase.

FIG. 12 shows once again, a finger 1200 that couples in the same way to the circuit as water 1000, except that now there is the CHBM-CGndGnd coupling path. The existence of the finger 1200 slightly decreases CTxRx because it redirects some of the charge away from the sensor 150 and into the finger 1200.

When a user's finger 1200 is added to the circuit, it couples to the TX drive, the sensor 150, and the board's ground 170, but there is now also a coupling path through the user's human body model into earth ground and then some amount of coupling between earth ground and the board's ground.

Figure 13:
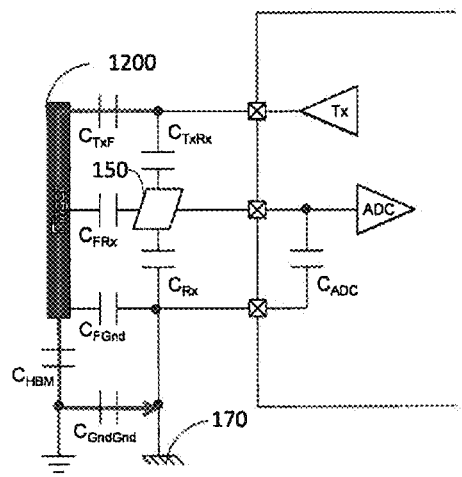

As shown in FIG. 13, if CGndGnd is not an open circuit, the Tx charge will be redirected into the board's ground 170. CTXRX is decreased as some of the TX charge is redirected into the sensor. However, unlike with water, the charge now travels down through the CHBM path and into the boards' ground 170 due to this path being larger than CFRX. The result is that the finger will decrease the mutual capacitance between guard/shield 250, 260, 270 and the sensor 150 which can be regarded as good as this is the opposite behavior of water. If CGndGnd is an open circuit, the Tx charge will behave in the same manner as water. The CHBM path has no effect. The result is that the finger 1200 will increase the mutual capacitance which is considered to be bad as this is the same behavior as water.

Also, according to a general principle of the various embodiments, it has to be remembered that self capacitance is increased because of the $C_{FRx}$-$C_{FGnd}$ path and the $C_{FRx}$-$C_{HBM}$-$C_{GndGnd}$ path. As a result, water or any other non-grounded contaminant causes self capacitance to increase and mutual capacitance to increase and a finger or any other grounded contaminant causes self capacitance to increase and mutual capacitance to decrease.

Figure 14:
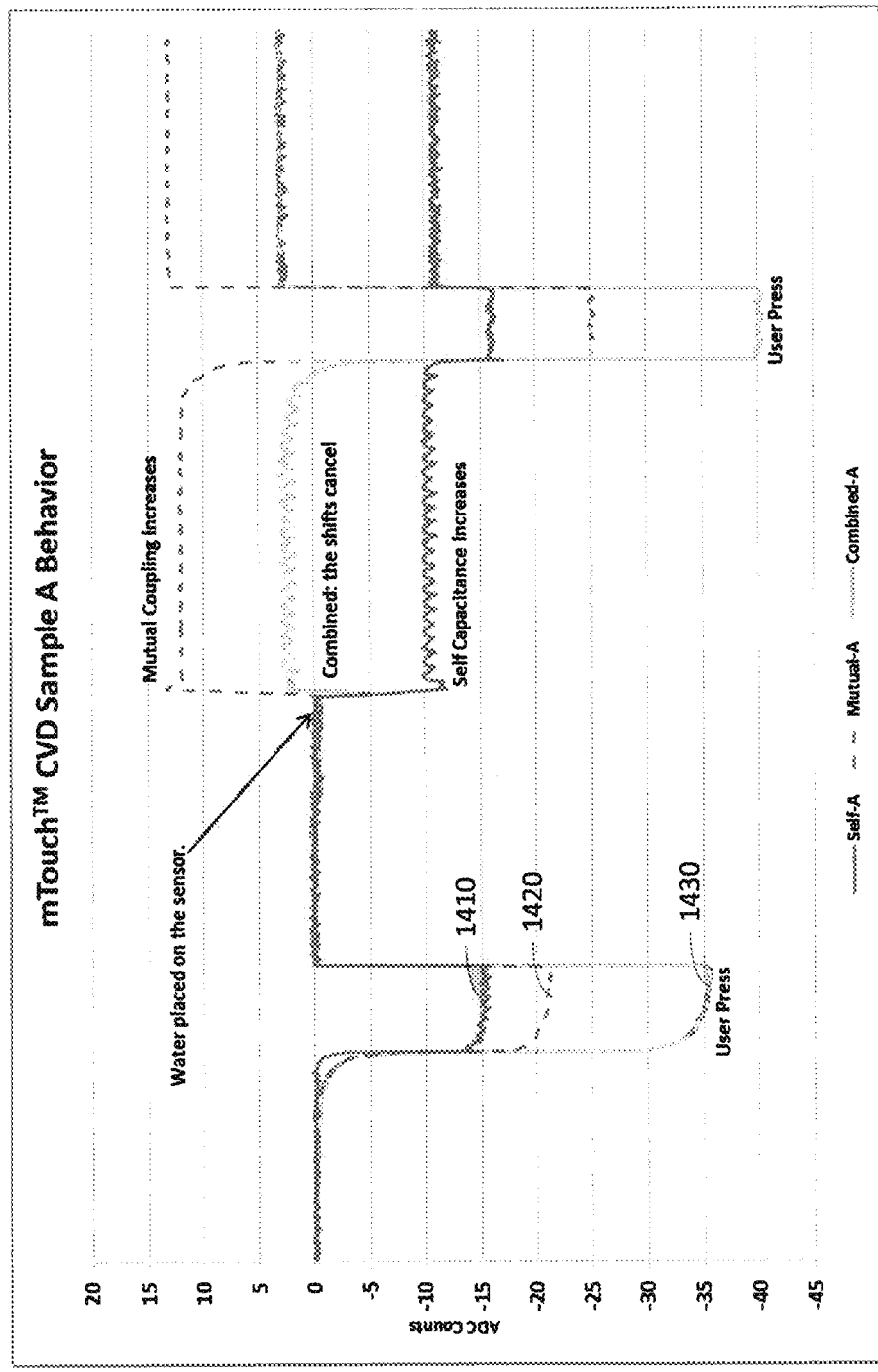
FIGS. 14 and 15 show a timing diagram for a first and second measurement, respectively of self capacitance, mutual capacitance and combination thereof with and without contamination.

FIG. 14 shows timing diagram of signal outputs of the same sensor scanned in three ways at the same time: Self capacitance only 120 is shown with signal 1410. Here, the TX line is not driven, so there is no AC coupling. Mutual capacitance only 125 is shown with signal 1420. Here, the 'charge sharing' of the CVD waveform is not performed, but the TX line is driven. This results in only AC coupling. Finally, signal 1430 shows the result when both self capacitance measurement and mutual capacitance measurement as shown in FIG. 9 are performed at the same time. In other words CVD is performed and the TX line is driven.

FIG. 14 shows output signals of the ADC for a first measurement, in other words the measurement made at time t3 in FIG. 9. Along the time line two user press events are shown wherein the first half is a measurement for a "clean" sensor and approximately in the middle of the graph water is added and a second press event takes place. Thus, the left half of the timing diagram in FIG. 14 shows a measurement without ungrounded contaminant wherein the right half shows a similar measurement with ungrounded contaminant, such as water. Generally, when water is added, for the first measurement of the CVD waveform, an increase in the self capacitance causes the signal to decrease as shown in the right half with signal 1410. When water is added, an increase in the mutual capacitance causes the signal 1420 to increase as shown in the right half.

When a finger presses on the clean system: The self-capacitance 120 increases, causing the final settled voltage t3 to go down. The mutual capacitance 125 decreases, causing the final settled voltage to go down. The combined effect is a large negative shift in the settled voltage.

When water is added to the system as shown in the center of FIG. 14, the self capacitance 120 increases and the mutual capacitance 125 decreases. They shift in opposite directions because of the design in how signal 900 is driven. A combination of both effects will therefore balance out the output signal and basically no shift or only a little shift is produced. This results in a water resistance at the analog level according to various embodiments.

When a finger presses with water on the sensor as shown on the right side of FIG. 14: The self-capacitance 120 increases due to the extra parallel capacitance of the human body model, causing the final settled voltage 1410 to go down slightly. The water is now charged by the finger and the mutual-capacitance 125 decreases as the TX charge is redirected to ground. This causes the final settled voltage 1420 to go down significantly. The combined effect 1430 is a large negative shift similar to a press in a dry environment.

Figure 15:
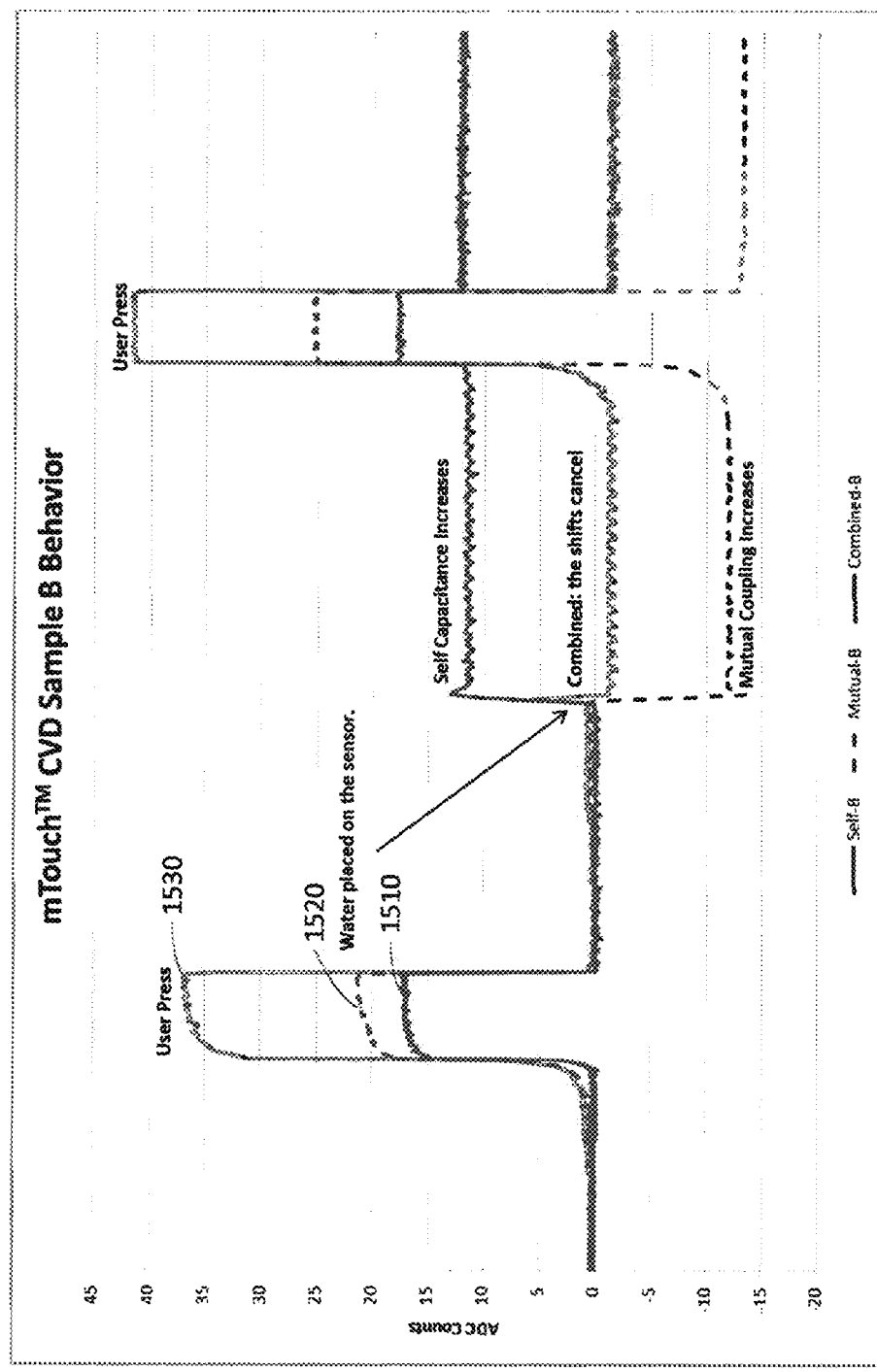

FIG. 15 shows the exact same as FIG. 14, but now for the second measurement of the CVD measurement, in other words the measurement performed at time t6 in FIG. 9. Hence, the signal form is basically reversed to the signals shown in FIG. 14 and signal 1510 corresponds to signal 1410, signal 1520 corresponds to signal 1420, and signal 1530 corresponds to signal 1430. For the second measurement in a CVD measurement, an increase in the self capacitance causes the signal to increase and an increase in the mutual capacitance causes the signal to decrease. Thus, the directions are different, but the behavior is the same as for the signals in FIG. 14.

Thus, in general, according to various embodiments, the exact behaviors of the self and mutual capacitance changes don't matter as long as they are differential with respect to non-grounded objects, and non-differential with respect to grounded objects.

Figure 16:
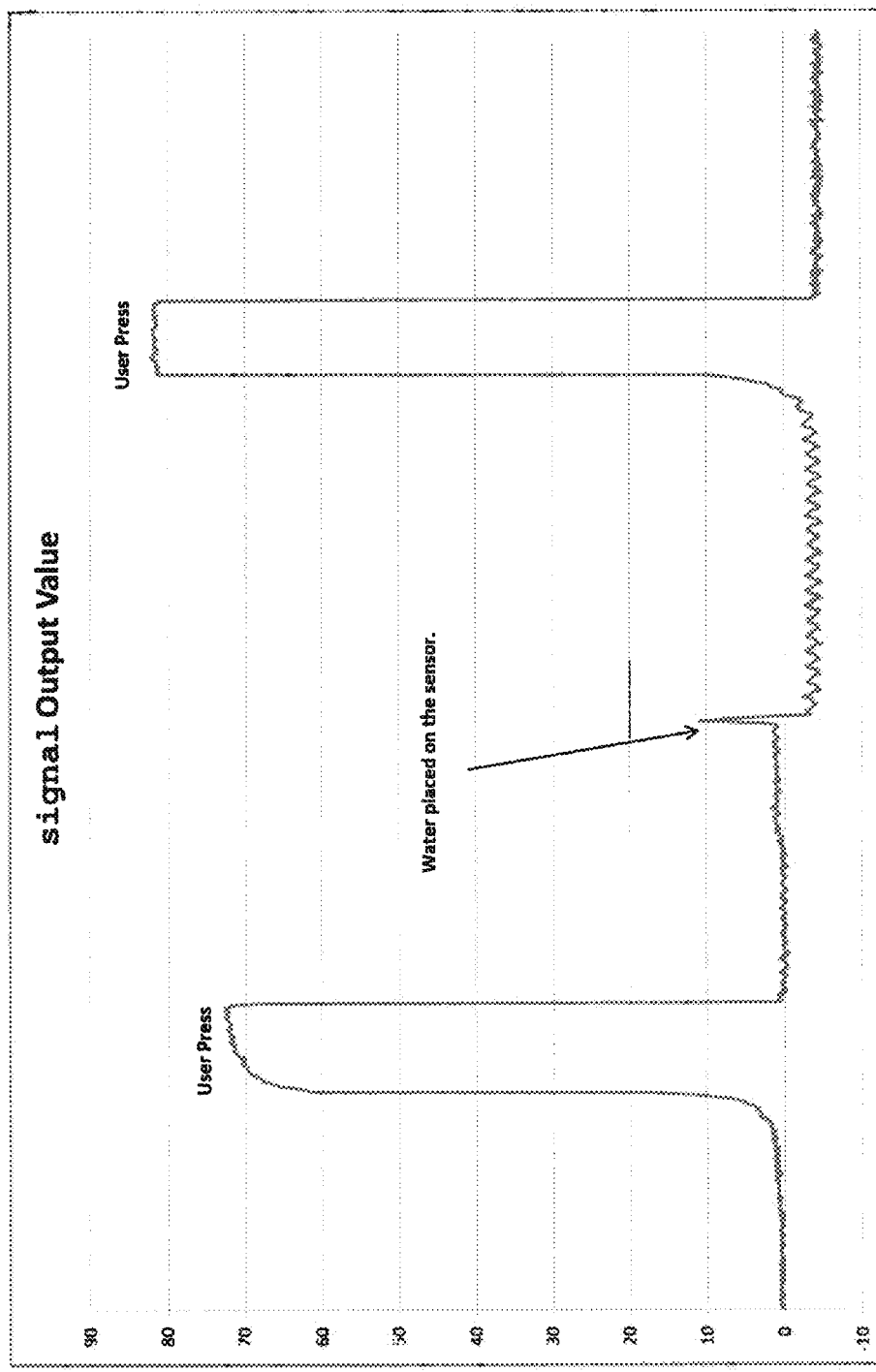
FIG. 16 shows a timing diagram of a processed output value for user touch events of a sensor with and without contamination.

FIG. 16 shows a final output signal processed by subtracting the first measurement signal 1430 from the second measurement signal 1530. Water resistance is ensured at the signal/analog level. No software decoding is required, no pattern recognition, and no additional filtering are necessary. Signal shifts appear due to the finger or grounded conductive object, but are eliminated when the water or conductive object is ungrounded.

Figure 17:
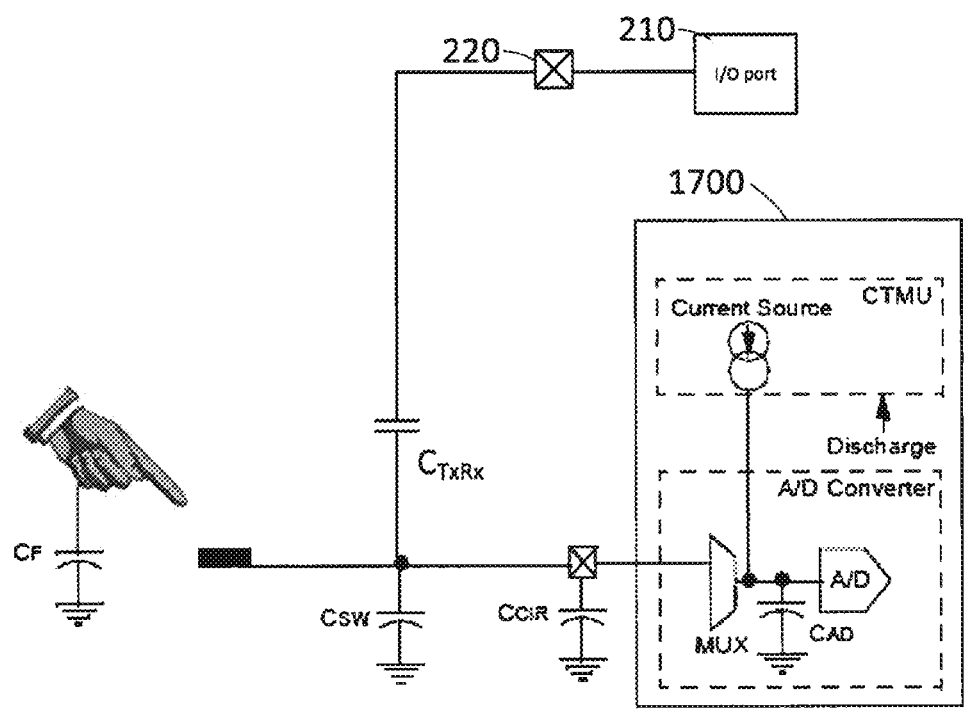
FIG. 17 shows an example of an arrangement according to other embodiments using a different capacitance measurement system.

As mentioned above, other measurement units may be used. FIG. 17 shows for example a charge time measurement unit integrated in a microcontroller 1700 that can be used to measure capacitance. For example, in a touch application as shown in FIG. 17 with a total capacitance including parasitics, like the switch (CSW) and circuit (CCIR) of 30 pF, when the external circuit is charged with a constant current of for example, 5.5 µA for 10 µs, this produces a voltage of 1.83V. When the touch of a finger is added, an additional capacitance (CF) of up to 10 pF is added. The exact amount of capacitance depends on how much the touch pad is covered by the finger and any covering material over the pad. For a 10 pF change, with the same current and charge time, the voltage is 1.38V. The voltage is measured at frequent intervals by the microcontroller's A/D Converter. Changes, particularly decreases, can then be interpreted as a touch event. During the charging of the external capacitor, a high impedance input is established and the mutual capacitance measurement may be performed.

Figure 18:
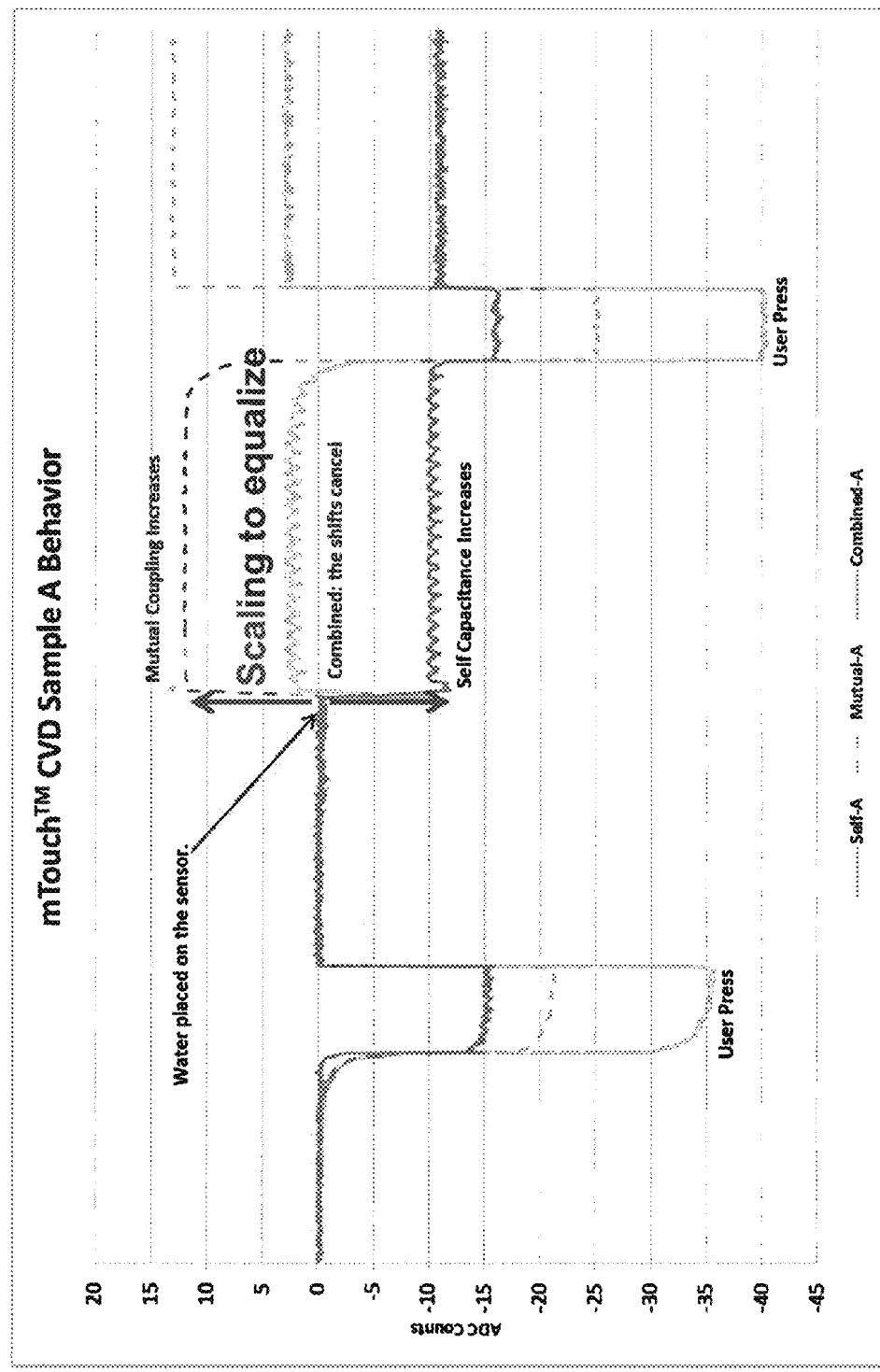
FIG. 18 shows the effect of scaling the measurements.

When the self and mutual capacitances of a circuit are equivalent, their behaviors can be combined as stated above to eliminate the effect of non-grounded conductive objects on a capacitive sensor. If self and mutual capacitances of a circuit are not equivalent, the effectiveness of this solution is dramatically reduced. Thus, as shown in FIG. 18 according to further embodiments a similar result as described above can be achieved with individual measurements that are combined by software. A scaling can then be performed in software to further improve the measurement. For equalizing purposes, according to some embodiments, the relative change of the 'mutual capacitance' measurement can be scaled with the relative change of the 'self capacitance' measurement. If mutual and self are not equivalent, their signals can be taken independently just as it has been done to explain the data for the combined measurement and weight their behaviors to be equivalent. Thus a simple function can be performed in software to scale the effects of 'mutual capacitance' measurement to the effect of the 'self capacitance' measurement. This would, however, require a little bit of processing and a longer measurement since two separate measurements are necessary, then scaling of one measurement and combination of the two self and mutual capacitance measurement results.

Alternatively, according to other embodiments, a calibration routine could be performed in which the results of the individual measurements are determined and the measurement parameters are adjusted to scale the results. Once this has been accomplished, a combined measurement as described above could be performed wherein the voltage levels are now adapted according to the calibration routine. Thus, during calibration, each capacitance measurement is performed individually. For example, first the self capacitance is measured and then under the same conditions, the mutual capacitance measurement is performed. According to some embodiments, an average value for each measurement can be processed and an equalization factor can then be calculated. According to one embodiment, voltage or other respective parameters are adjusted in a loop until the scaling reaches the correct output value, in other words, until the output data of the self capacitance measurement are approximately equal to the output data of the mutual capacitance measurement. This factor can then be applied to either the mutual capacitance measurement or to the self capacitance measurement depending on how the factor is determined. In other words, the charging signals or the pulse signal amplitude are adjusted by the scale factor to optimize the combined self and mutual capacitance measurement. Once this has been performed, a touch detection can be performed using the combined technique.

To this end, for example a digital-to analog converter (DAC) 670, as shown in an alternative embodiment in FIG. 6 using dashed lines, can be used in conjunctions with an optional op-amp 210 to generate the pulse used for a mutual capacitance measurement. According to some embodiments, the output voltage of the DAC 670 may be varied according to the scale factor. Alternatively, the charging voltages for the self capacitance measurement may be provided by a programmable reference voltage generator or a DAC 680 instead of using VDD. This is also shown as an alternative embodiment in FIG. 6 using dashed lines. Hence, according to some embodiments, the reference voltage used for charging and/or the pulse output voltage may be varied according to the calculated scale factor.

Again, this may apply to any type of capacitance measurement that uses a high impedance input. However, with respect to certain measurement techniques, other factors may be varied. For example, with respect to a charge time measurement unit, either the time or the constant current value or both may be adjusted. Thus, which parameter is changed depends on the respective measurement technique. In summary, individual self and mutual capacitance signals can be scaled in software to equalize their magnitudes, then combined to produce one sensor output signal according to some embodiments.

What is claimed is:

1. A method for performing a touch determination with a capacitive sensor, comprising:
    performing a calibration method, wherein the calibration method is performed before performing the touch determination, the calibration method comprising:
        performing an individual self capacitance measurement and storing a first measurement value;
        performing an individual mutual capacitance measurement and storing a second measurement value; and
        calculating a scale factor from said first and second measurement values;
    initiating a self capacitance measurement of a capacitive sensor, wherein at the same time a mutual capacitance measurement including the capacitive sensor is performed; and
    applying said scale factor to said self capacitance or said mutual capacitance measurement.

2. The method according to claim 1, wherein after the sensor has been set to a high impedance state during the self capacitance measurement, capacitively coupling a pulse into the capacitive sensor for performing the mutual capacitance measurement.

3. The method according to claim 2, wherein a shield or guard electrode is arranged in proximity to the capacitive sensor to provide a capacitive coupling.

4. The method according to claim 1, wherein the self capacitance measurement is a capacitive voltage divider measurement.

5. The method according to claim 1, wherein the self capacitance measurement is a charge time measurement.

6. A method for performing a touch determination with a capacitive sensor, comprising:
    performing a calibration method to determine a scaling factor, wherein the calibration method is performed before performing the touch determination, the calibration method comprising:
        performing an individual self capacitance measurement and storing a first measurement value;
        performing an individual mutual capacitance measurement and storing a second measurement value; and
        calculating a scaling factor from said first and second measurement values;
    initiating a self capacitance measurement of a capacitive sensor,
    initiating a mutual capacitance measurement including the capacitive sensor;
    performing a scaling of either an output value of the self capacitance measurement or the mutual capacitance measurement; and
    combining the output values of the self capacitance measurement and the mutual capacitance measurement.

7. The method according to claim 6, wherein combining the output values comprises adding the output values.

8. The method according to claim 6, wherein a shield or guard electrode is arranged in proximity to the capacitive sensor to provide a capacitive coupling.

9. The method according to claim 6, wherein the self capacitance measurement is a capacitive voltage divider measurement.

10. The method according to claim 6, wherein the self capacitance measurement is a charge time measurement.

11. A method for performing a touch determination with a capacitive sensor, comprising:
    performing a calibration method, wherein the calibration method is performed before performing the touch determination, the calibration method comprising:
        performing an individual self capacitance measurement and storing a first measurement value;
        performing an individual mutual capacitance measurement and storing a second measurement value; and
        calculating a scale factor from said first and second measurement values;

initiating a self capacitance measurement of a capacitive sensor, wherein at the same time a mutual capacitance measurement including the capacitive sensor is performed such that the self capacitance measurement and the mutual capacitance measurement differentially cancel with ungrounded conductive objects approaching or touching said capacitive sensor and additively combine for grounded objects approaching or touching said capacitive sensor; and applying said scale factor to said self capacitance or said mutual capacitance measurement.

* * * * *